US008188760B2

(12) United States Patent
Patterson (10) Patent No.: US 8,188,760 B2
(45) Date of Patent: *May 29, 2012

(54) CURVE TRACER SIGNAL CONVERSION FOR INTEGRATED CIRCUIT TESTING

(75) Inventor: Joseph Martin Patterson, Carlsbad, CA (US)

(73) Assignee: Applied Micro Circuits Corporation, San Diego, CA (US)

( * ) Notice: Subject to any disclaimer, the term of this patent is extended or adjusted under 35 U.S.C. 154(b) by 404 days.

This patent is subject to a terminal disclaimer.

(21) Appl. No.: 12/551,524

(22) Filed: Aug. 31, 2009

(65) Prior Publication Data

US 2011/0031993 A1 Feb. 10, 2011

Related U.S. Application Data

(63) Continuation-in-part of application No. 12/541,058, filed on Aug. 13, 2009, now Pat. No. 8,106,671, which is a continuation-in-part of application No. 12/535,533, filed on Aug. 4, 2009, now Pat. No. 7,768,283.

(51) Int. Cl.
*G01R 31/20* (2006.01)
*G01R 31/00* (2006.01)

(52) U.S. Cl. ......... 324/762.01; 324/754.03; 324/755.01

(58) Field of Classification Search ............ 324/754.08–754.09, 757.02–757.05, 762.01–762.09
See application file for complete search history.

(56) References Cited

U.S. PATENT DOCUMENTS

| | | | |
|---|---|---|---|
| 5,722,159 A * | 3/1998 | Stratas ........................... 29/832 |
| 5,777,487 A * | 7/1998 | Burgess et al. .......... 324/750.03 |
| 6,246,250 B1 * | 6/2001 | Doherty et al. .......... 324/754.07 |
| 7,091,733 B2 * | 8/2006 | Takekoshi et al. ....... 324/750.03 |
| 7,272,760 B2 * | 9/2007 | Tan et al. ...................... 714/724 |
| 7,355,426 B2 * | 4/2008 | Ahmad et al. ........... 324/756.02 |
| 7,768,283 B1 * | 8/2010 | Patterson ................. 324/754.09 |
| 8,106,671 B2 * | 1/2012 | Patterson ................. 324/754.01 |
| 2003/0038365 A1 * | 2/2003 | Farnworth et al. ............ 257/723 |

* cited by examiner

*Primary Examiner* — Joshua Benitez

(74) *Attorney, Agent, or Firm* — Law Office of Gerald Maliszewski; Gerald Maliszewski

(57) ABSTRACT

A curve tracer signal conversion device is provided. The signal conversion device has an input connected to the curve tracer base port to accept a repeating sequence of stepped base signals. The conversion device has a signal input connected to either the curve tracer collector or emitter port, typically the collector. The conversion device has a plurality of signal outputs, where each signal output is sequentially connected to the selected (i.e. collector) curve tracer port in response to a corresponding base step signal. The signals outputs may be provided to a test fixture, for testing a multi-pin integrated circuit (IC).

18 Claims, 8 Drawing Sheets

CURVE TRACER SIGNAL CONVERSION FOR INTEGRATED CIRCUIT TESTING

RELATED APPLICATIONS

This application is a Continuation-in-Part of a application entitled, SOCKETLESS INTEGRATED CIRCUIT CONTACT CONNECTOR, invented by Joseph Patterson, Ser. No. 12/541,058, filed Aug. 13, 2009 now U.S. Pat. No. 8,106,671; which is a Continuation-in-Part of a application entitled, UNIVERSAL SOCKETLESS TEST FIXTURE, invented by Joseph Patterson, Ser. No. 12/535,533, filed Aug. 4, 2009 now U.S. Pat. No. 7,768,283. Both the above-mentioned applications are incorporated herein by reference.

BACKGROUND OF THE INVENTION

1. Field of the Invention

This invention generally relates to integrated circuit (IC) test fixtures and, more particularly, to a universal socketless test fixture using a curve tracer and an associated conversion device to supply fixture test signals.

2. Description of the Related Art

As noted in U.S. Pat. No. 7,554,206, it is valuable to test the electrical connections between the sockets of an IC in order to identify poor connections and defective active circuitry. IC devices have evolved from through-board pins to the surface mounting of a device to a socket and PCB. The input and output contacts of an IC chip are generally disposed in grid-like patterns that substantially cover a surface of the device or in elongated rows which may extend parallel to and adjacent each edge of the device's front surface, or in the center of the front surface. Typically, devices such as chips must be physically mounted on a substrate such as a printed circuit board, and the contacts of the device must be electrically connected to electrically conductive features of the circuit board.

For example, surface mounted packages commonly include a dielectric element, commonly referred to as a "chip carrier" with terminals formed as plated or etched metallic structures on the dielectric. These terminals are typically connected to the contacts of the chip itself by features such as thin traces extending along the chip carrier itself and by fine leads or wires extending between the contacts of the chip and the terminals or traces. In a surface mounting operation, the package is placed onto a circuit board so that each terminal on the package is aligned with a corresponding contact pad on the circuit board. Solder or other bonding material is provided between the terminals and the contact pads. The package can be permanently bonded in place by heating the assembly so as to melt or "reflow" the solder or otherwise activate the bonding material.

Semiconductor chips are commonly provided in packages that facilitate handling of the chip during manufacture and during mounting of the chip on an external substrate such as a circuit board or other circuit panel. An IC that is designed to be surface mounted has pads, or flat conductive discs, on its packaging. Many packages include solder masses in the form of solder balls, typically about 1.0 mm and about 0.8 mm (40 mils and 30 mils) in pitch, and 0.4 to 0.5 mm in diameter, attached to the terminals of the package. A package having an array of solder balls projecting from its bottom surface is commonly referred to as a ball grid array or "BGA" package. For a BGA device there are solder bumps on the pads for connection with a BGA socket. The solder bumps typically fit into grips on a BGA socket for connection to a PCB. Other packages, referred to as land grid array or "LGA" packages are secured to the substrate by thin layers or lands (pads) formed from solder. The pads of an LGA require a socket containing springs or some other type of conductive trace to connect the device to the PCB.

In testing packaged devices, it is necessary to make temporary connections between the terminals of the packaged device and a test fixture, and operate the device through these connections to assure that the device is fully functional. Ordinarily, these temporary connections must be made without bonding the terminals of the package to the test fixture. It is important to assure that all of the terminals are reliably connected to the conductive elements of the test fixture.

A socket is typically used to interface IC contacts to a test fixture. A socket may have a plastic body, metal contacts, and a metal lever or latch to temporary secure the IC to the socket—physically securing the IC under test, as well as causing an electrical connection between all the IC pins and the socket.

A test fixture may consist of an array of switch pairs, where one switch connects a single signal trace to a single power trace and the other switch connects the signal trace to a single ground trace. Multiple switch pairs are used to connect all signal traces to independent power and ground traces. Typically, the sockets make electric connections to all the device pins simultaneously. Automation of the process requires a relay/relay driver circuit for each device pin.

Conventionally, the test fixture uses a socket designed for the specific pin count and physical spacing of the package pins. However, these test fixture are often custom made and, therefore, expensive. Further, a test facility may require a multiplicity of sockets and interface boards for a large variety of package types. Finally, because of the cost of socket interfaces, it becomes prohibitively expensive to upgrade the electrical components of the test fixture, to support complicated test algorithms such as curve tracing.

Testing may be supported through the use of a conventional curve tracer. Without a socket, however, hand probing of each pair of device pins is required, which does not lend itself to efficient automated data collection on high pin count packages. A clip-on mechanism with a hook-shaped wire is known to be used in connecting to individual IC contacts. However, the spring loading is within a rigid plastic housing that is too large to fit in the spaces between the BGA rows. Alternately, micromanipulators with needle probes must be used.

It would be advantageous if a socketless test fixture could measure the electrical performance of IC contacts using a conventional curve tracer.

SUMMARY OF THE INVENTION

Disclosed herein is a test fixture that provides a means to make contact to many pins of a packaged IC, without the use of a socket, permitting curve tracer analysis on all pins contacted and real-time interactive curve tracer analysis. The test fixture reduces the need for high pin-count sockets. By simplifying the automated curve tracer analysis process, the real-time examination of electrical characteristics is enabled. Thus, defects can be observed such as drift, intermittence, and noise, which are unstable and change in a short time frame. This analysis is not available with conventional fully automated curve trace analysis. Further, the cost of high pin count automated curve tracer systems, and high pin count sockets are prohibitively high.

A conventional manual curve tracer displays curves for one device pin at a time. In the transistor beta test mode, the waveform at the base generator terminal provides a stair step waveform of up to ten steps. These steps typically drive the same pin of a transistor under test at ten different base current (or voltages for an FET transistor). The resultant curves are displayed simultaneously as a family of curves.

A curve tracer signal conversion device is presented herein that generates timing and control signals from the base generator terminal output of a conventional curve tracer, to permit the viewing and storage of multiple device pin traces, instead of just one. As a result, it is possible to quickly measure curve tracing from a high pin count devices. The measurement and storage process can be completely automated when combined with automated probe card movement.

More explicitly, the base terminal waveform is a voltage stair step, which is converted into a sequence of clock pulses, followed by a reset pulse at the end of the stair step waveform. These clock pulses and reset pulses drive a decade counter, and the decade counter outputs drive relays. The common node of each relay is connected to the collector terminal of the curve tracer, and selectively connected to the individual pins of the device under test (DUT). Because the pulses are synchronized from the base terminal waveform, the relay switch time is coincident with the step waveforms that are presented on the curve tracer display. Thus, each curve on the curve tracer display (and in memory) is associated with a different pin of the DUT.

Accordingly, a curve tracer signal conversion device is provided. The signal conversion device has an input connected to the curve tracer base port to accept a repeating sequence of stepped base signals. The conversion device has a signal input connected to either the curve tracer collector or emitter port, typically the collector. The conversion device has a plurality of signal outputs, where each signal output is sequentially connected to the selected (i.e. collector) curve tracer port in response to a corresponding base step signal.

More explicitly, the conversion device includes a high pass filter connected to a curve tracer base (B) port, and an output to supply a filtered sequence of stepped base signals. A reset module is connected to the filtered repeating sequence of stepped base signals, with an output to supply a reset trigger following each sequence. A selector module also accepts the filtered repeating sequence of stepped base signals, and has an output to supply a sequence of selection signals in response to the corresponding sequence of stepped base signals. A counter has a reset input to accept the reset trigger and a clock input to accept the selection signal. The counter has a plurality of parallel outputs, where each output is enabled in sequence in response to the corresponding sequence of selection signals. The sequence of outputs is reset to an initial output in response to the reset trigger.

Additional details of the above-described curve tracer conversion device, a curve tracer conversion system, and a universal socketless IC test fixture employing the curve tracer conversion device are provided below.

DETAILED DESCRIPTION

Figure 1:
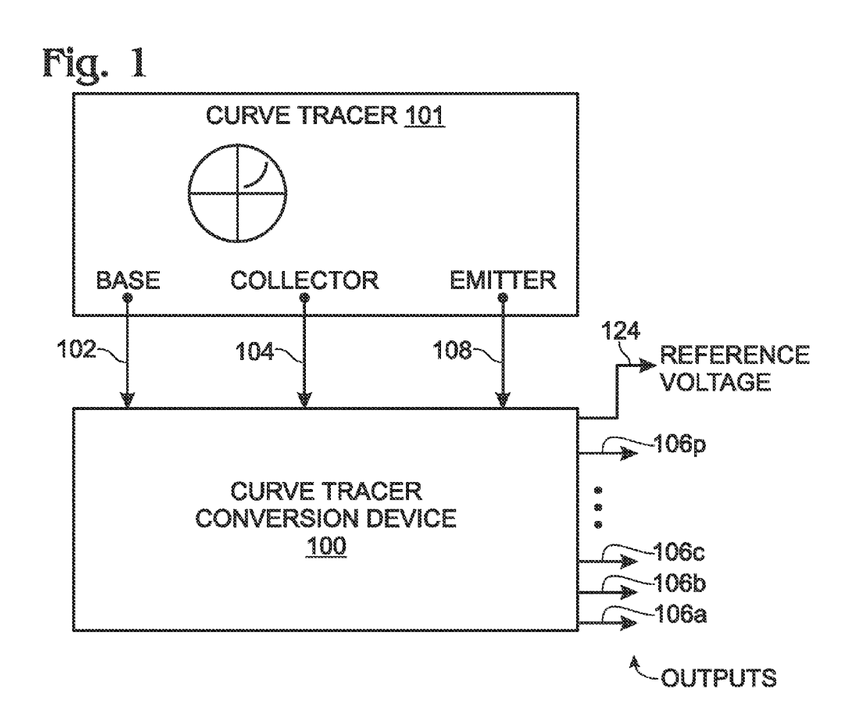
FIG. 1 is a schematic block diagram of a curve tracer signal conversion device.

FIG. 1 is a schematic block diagram of a curve tracer signal conversion device. The signal conversion device 100 comprises an input on line 102 connected to a curve tracer 101 base port to accept a repeating sequence of stepped base signals. The conversion device 100 has a signal input on line 104 connected to either the curve tracer collector or emitter ports, which is referred to herein as the "selected" port. The conversion device 100 has a plurality of signal outputs 106, where each signal output is sequentially connected to the selected curve tracer port in response to a corresponding base step signal. Shown are signal output ports 106a through 106p, where p is a variable not limited to any particular value. The unselected (e.g., emitter port) is connected to the conversion device on line 108 to supply a reference voltage. The conversion device supplies the reference voltage to a unit under test on line 124.

Figure 2:
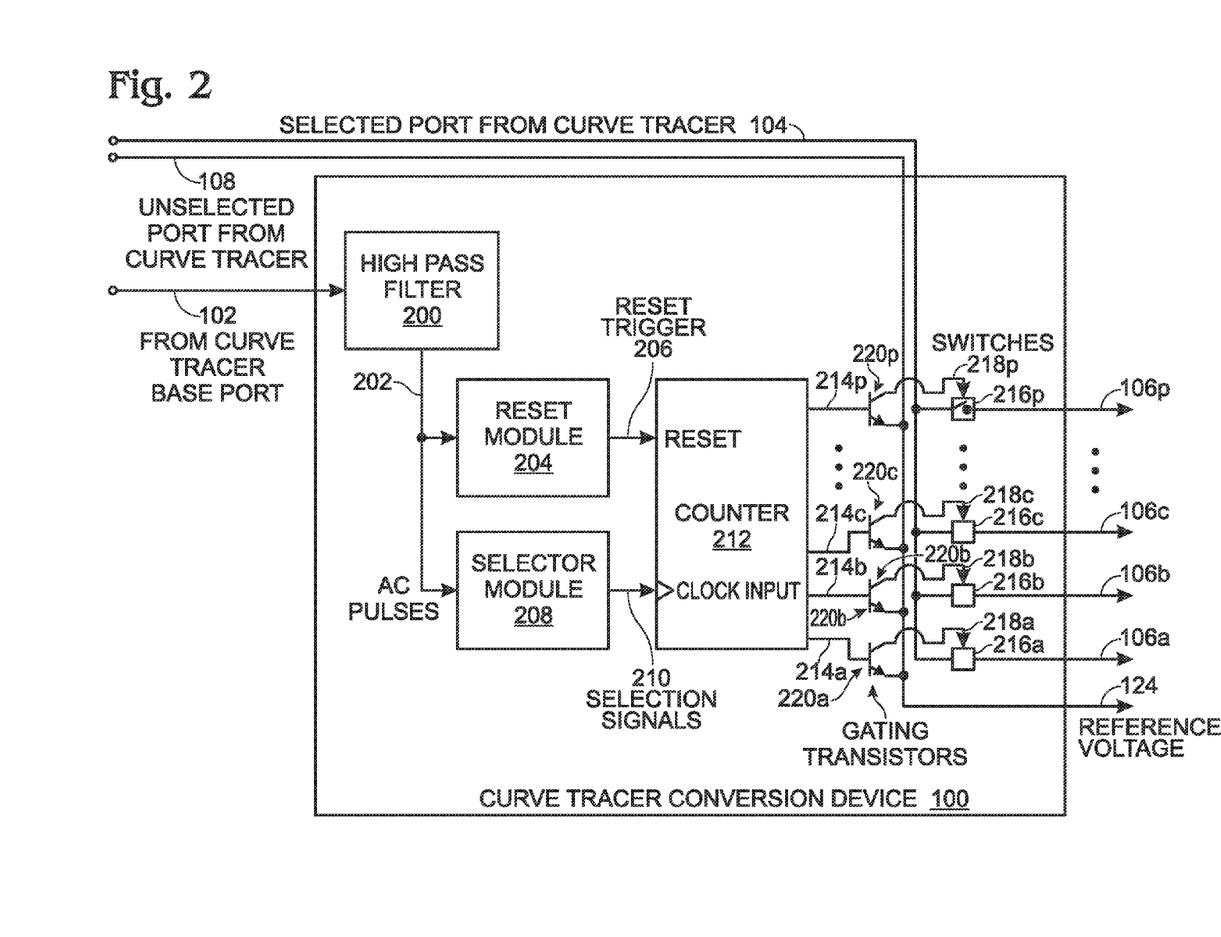
FIG. 2 is a more detailed schematic block diagram of the curve tracer conversion device of FIG. 1.

FIG. 2 is a more detailed schematic block diagram of the curve tracer conversion device of FIG. 1. A high pass filter 200 has an input connected to the curve tracer base port on line 102, and an output on line 202 to supply a filtered sequence of stepped base signals. In one aspect, the high pass filter 200 comprises a series capacitor and a shunt resistor. The high pass filter 200 forms a differentiating circuit that responds (passes) to the faster transitions of each step change and the falling edge at the end of the group of steps. This response means that pulses are produced at the transitions, with no change in response to the DC level changes of the steps. That is, the signals on line 204 are AC pulses, with no DC component.

A reset module 204 has an input connected to the high pass filter output on line 202 to accept the filtered repeating sequence of stepped base signals (AC pulses), and an output on line 206 to supply a reset trigger following each sequence. A selector module 208 has an input connected to the high pass filter output on line 202 to accept the filtered repeating sequence of stepped base signals. The selector module has an output on line 210 to supply a sequence of selection signals in response to the corresponding sequence of stepped base signals. A counter 212 has a reset input on line 206 to accept the reset trigger and a clock input on line 210 to accept the selection signal. The counter 212 has a plurality of parallel outputs 214; outputs 214a through 214p are shown. Each output 214 is enabled in sequence in response to the corresponding sequence of selection signals. The sequence of outputs is reset to an initial output in response to the reset trigger.

The conversion device 100 also comprises a network of parallel switches 216. Switches 216a through 216p are shown. Each switch 216 has a signal input connected to the curve tracer selected port. For example, the switch signal inputs may be connected to the collector port. Each switch 216 has a control input on line 218, and a signal output connected to a signal conversion device output on line 106.

In one aspect as shown, gating transistors 220a through 220p are interposed between the switches 216 and the counter outputs on line 214. Each transistor 220 has a base connected to a corresponding counter output on line 214, a collector connected to a corresponding switch control input on line 218, and an emitter connected to the unselected curve tracer port on line 108. A reference voltage port is connected to the unselected curve tracer port on line 108, to supply a reference voltage 124.

Figure 3:
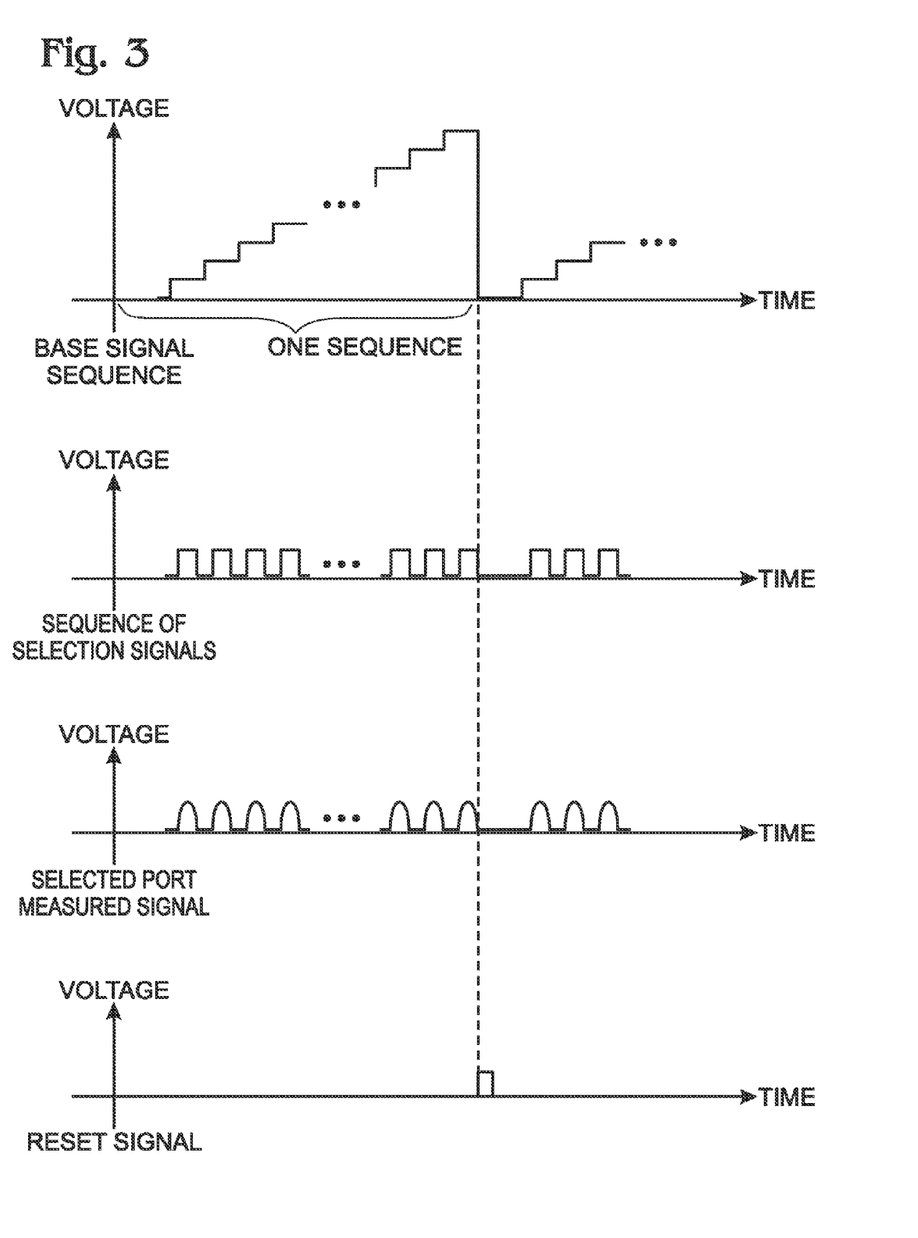
FIG. 3 is a timing diagram depicting the relationship between the base signal sequence, the sequence of selection signals, the sequence of conversion device signal outputs (selected port measured electrical response), and the reset signal.

FIG. 3 is a timing diagram depicting the relationship between the base signal sequence, the sequence of selection signals, the sequence of conversion device signal outputs (selected port measured electrical response), and the reset signal.

Figure 4:
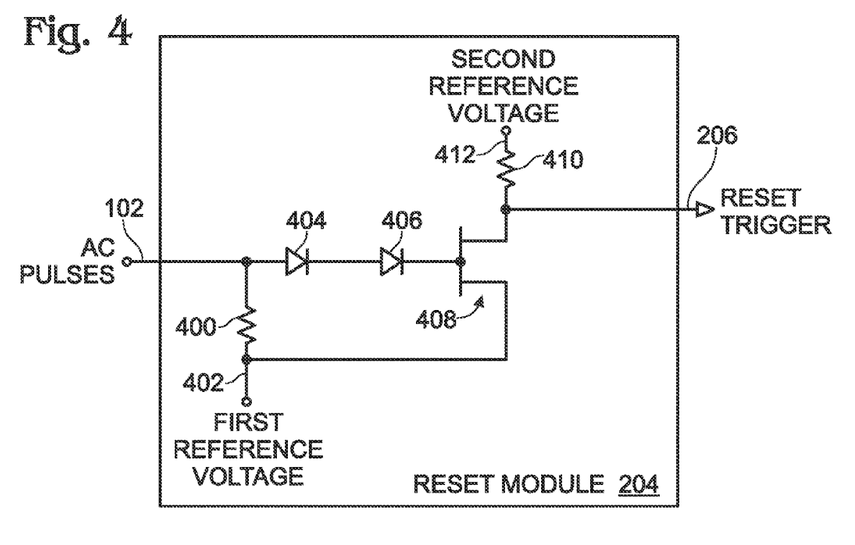
FIG. 4 is a detailed schematic of an exemplary reset module.

FIG. 4 is a detailed schematic of an exemplary reset module. The reset module 204 comprises a first resistor 400 having a first end connected the reset module input on line 202 and a second end connected to a first reference voltage on line 402. For example, the first reference voltage can be ground. A first diode 404 has an anode connected to the reset module input on line 202, and a cathode. In one aspect not shown, the diode is a transistor with a floating collector. A second diode 406 has an anode connected to the first diode 404 cathode, and a cathode. An N channel JFET 408 has a gate connected to the second diode cathode, a source connected to the first reference voltage on line 402, and a drain connected to the counter reset input on line 206. A second resistor 410 has a first end connected to the JFET drain, and a second end connected to a second reference voltage on line 412. The second reference voltage has a higher potential that the first reference voltage. It should be understood that a practitioner versed in the art would be able to enable the same functionality using an alternate collections of parts and voltages.

Figure 5:
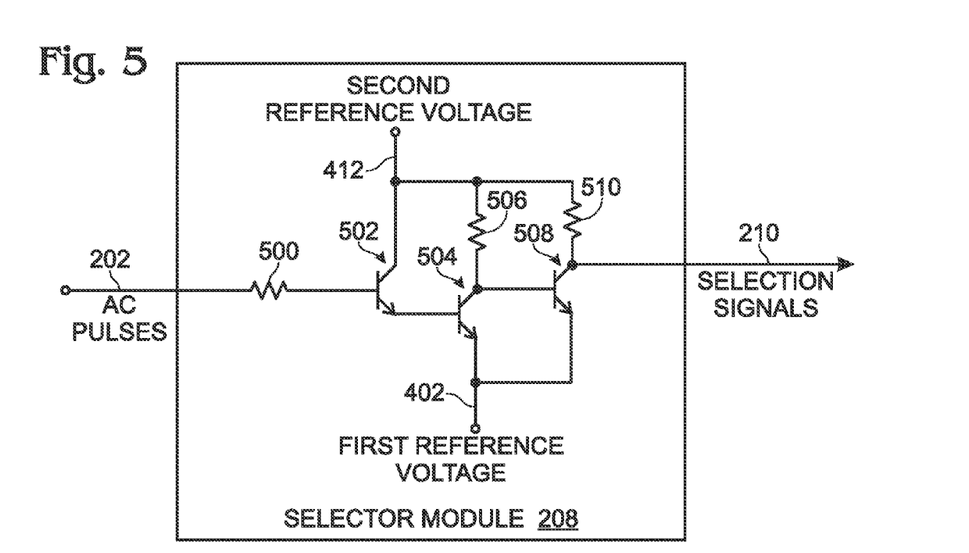
FIG. 5 is a detailed schematic of an exemplary selector module.

FIG. 5 is a detailed schematic of an exemplary selector module. A first resistor 500 has a first end connected to the selector module input on line 202, and a second end. A first npn transistor 502 has a base connected to the first resistor second end, a collector connected to the second reference voltage on line 412, and an emitter. A second npn transistor 504 has a base connected to the first npn transistor 502 emitter, an emitter connected to the first reference voltage on line 402, and a collector. A second resistor 506 has a first end connected to the second npn transistor 504 collector, and a second end connected to the second reference voltage on line 412. A third npn transistor 508 has a base connected to the second npn transistor 506 collector, an emitter connected to the first reference voltage on line 402, and a collector connected to the clock input of the counter on line 210. A third resistor 510 has a first end connected to the third npn transistor 508 collector, and a second end connected to the second reference voltage on line 412. It should be understood that a practitioner versed in the art would be able to enable the same functionality using an alternate collections of parts and voltages.

Figure 6:
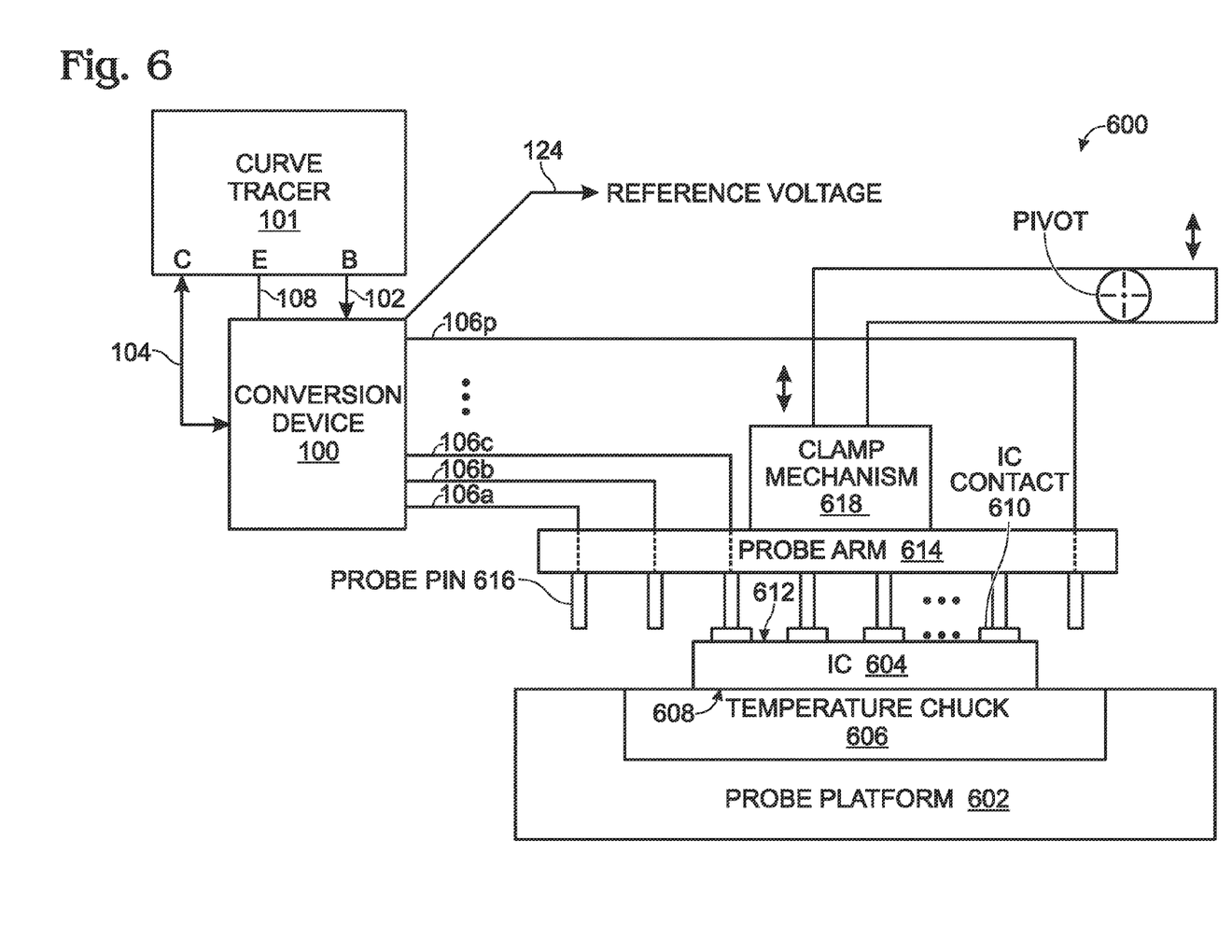
FIG. 6 is a schematic block diagram of a universal socketless integrated circuit (IC) electrical test fixture.

FIG. 6 is a schematic block diagram of a universal socketless integrated circuit (IC) electrical test fixture. The test fixture 600 comprises a probing platform 602 to accept an IC 604. In one aspect, the probe platform 602 is part of a heat sink, or includes a temperature chuck 606 to accept a top surface 608 of the IC 604. The temperature of the chuck 606 can be controlled to support environmental temperature testing of the IC 104. The IC 604 has electrical contacts 610 formed on a bottom surface 612 in an array of m rows, where each row includes n, or less contacts. A probe arm 614 includes p probe pins 616, where p is typically greater than, or equal to n. A spring-loaded pogo pin is one example of a probe pin. Note: n, m, and v are variables not limited to any particular value. When p is less than n, the probe arm position must be changed more often, if each IC contact is to be tested.

The test fixture 600 comprises the curve tracer 101 with base, collector, and emitter ports. The test fixture 600 further comprises the curve tracer signal conversion device 100. As explained above in the description of FIG. 1, the conversion device 100 has an input connected to the curve tracer 101 base port on line 102 to accept a repeating sequence of stepped base signals, a signal input connected to the curve tracer selected port (e.g., collector port) on line 104, and p signal outputs on line 106 (106a-106p), where each signal output 106 is connected to a corresponding probe pin 616. The probe pins 616 are sequentially connected to the selected curve tracer port in response to a corresponding base step signal. Details of the curve tracer conversion device are presented above in the explanation of FIGS. 2 through 5.

Figure 7:
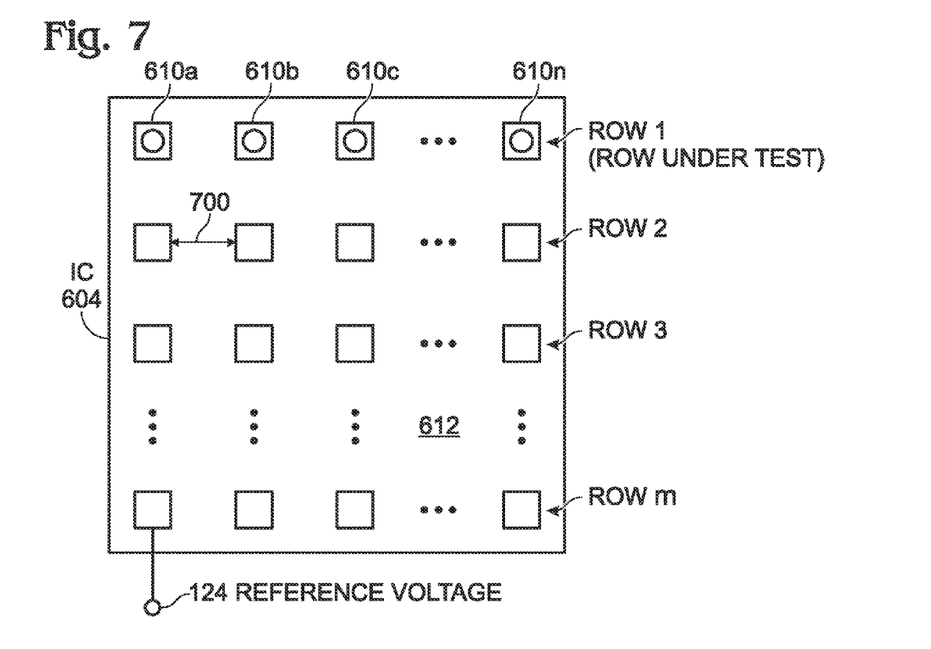
FIG. 7 is a plan view of the IC bottom surface showing m rows of IC contacts.

FIG. 7 is a plan view of the IC bottom surface showing m rows of IC contacts. In row 1, contacts 610a through 610n are shown, with a spacing 700 between contacts.

Figure 8:
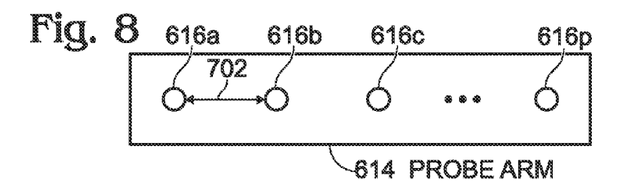
FIG. 8 is a plan view showing a row of probe pins mounted on the probe arm.

FIG. 8 is a plan view showing a row of probe pins 616 mounted on the probe arm 614. The spacing 702 between the probe pins 616 about matches the spacing between IC contacts (see FIG. 7). As shown, the p probe pins are mounted in the probe arm in a straight row. However, other probe pin mounting arrangements would be possible.

Returning to FIG. 6, a clamping mechanism 618 is used to mechanically interface the probe arm probe pins 616 to a row of n IC contacts 610 under test. A number of suitable mechanisms can be adapted for this purpose, and the test fixture is not limited to any particular one. The curve tracer selected port on line 104 is selectively connected to the p probe pins 616 of the probe arm to measure electrical characteristics associated with the IC contacts 610 under test. Some examples of electrical characteristics include current, voltage, real and imaginary impedances, and delay.

The probe arm 614, clamping mechanism 618, and probe platform 602 work in cooperation to electrically interface any row of the IC contacts with the electrical measurement device. That is, the clamping mechanism can be engaged and disengaged to so that each row of IC contacts can be tested in sequence. The test fixture is not limited to testing an IC with any particular array pattern. Typically, the spacing between the IC contacts approximately matches the spacing between probe pins. In one aspect, the probe arm 614, clamping mechanism 618, and probe platform 602 work in cooperation to automatically electrically interface every row of the IC contacts with the electrical measurement device, in succession. For example, the test fixture initially connects the probe arm to row 1 of IC contacts, and after completing testing, releases. After moving the probe arm or probe platform, the probe is applied to row 2 of the IC contacts. In that manner, the rows of IC contacts are tested in succession.

The curve tracer 101 supplies a reference voltage (the unselected port), via the interface on line 124, to one of the IC contacts under test, so that the electrical characteristics of the IC contacts under test are measured with respect to the reference voltage. In one aspect the reference voltage interface supplies both a ground and a power supply voltage, or a plurality of power supply voltages. In this case, at least one of the reference voltages is supplied by a source that is not the curve tracer.

In one aspect, a second probe arm (not shown) may be used as the second interface to supply the reference voltage. The second probe may have p probe pins. The movement of the second probe may be independent of the first probe arm. That is, the second probe arm may be connected to any row of IC contacts, independent of row connected to the first probe arm. As explained below in the context of the first probe arm 614, a second probe arm may be associated with a switching mechanism, so that a variety of different reference voltages may be switched to a particular IC contact (probe pin), or so that a reference voltage may be selectively supplied to different IC contacts (probe pins) interfaced to the second probe arm.

It should be understood that a curve tracer, as conventionally used in the step generator mode, can measure transistor collector electrical characteristics at a number of different base currents (voltages). Typically, the base current (voltage) is stepped, and the collector current (voltage) is measured at each step. As adapted for use with the test fixture of FIG. 6, each time the curve tracer "steps" to a new base current (voltage), a different signal input on line 106 is selected. Thus, for each base step, the curve tracer collector port measures electrical characteristics associated with a unique IC contact.

A further advantage to using the curve tracer base port to control the external switching is the simultaneous storage of the measurement in the curve tracer memory. Most digital curve tracers have internal memory storage capability. The memory storage is synchronized with the step waveform on the base port. Thus, the external measurement on the collector or emitter port is synchronized with the base port signal, and kept in a curve tracer internal memory. The external measurement can be recalled in response to referencing the base port voltage (switch control signal), which in turn, can be referenced to a particular IC contact.

Figure 9:
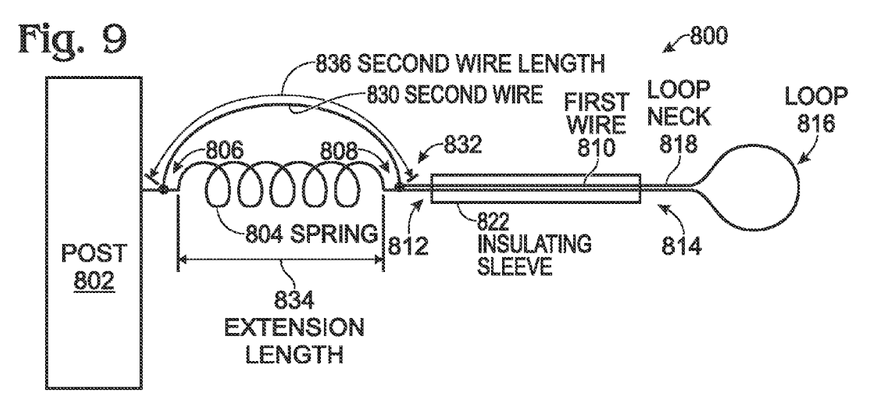
FIG. 9 is a diagram of a socketless IC contact connector.

FIG. 9 is a diagram of a socketless IC contact connector. The connector 800 comprises an electrically conductive support post 802. An electrically conductive spring 804 has a first end 806 connected to the post 802, and a second end 808. An electrically conductive first wire 810 has a first end 812 connected to the spring second end 808, and a second end 814. An electrically conductive loop 816 has a loop neck 818 connected to the first wire second end 814. In one aspect, the loop 816 is formed by looping the first wire second end 814. Alternately, the loop may be a separate element connected (e.g., soldered) to the first wire. As shown, the first wire 810 doubles-back on itself after forming the loop 816, so that the wire head and tail are both connected to the spring second end 808. The spring 804 and loop 816 work in cooperation to engage an IC contact. In one aspect as shown, an electrical insulating sleeve 822 overlies the first wire 810.

Figure 10A:
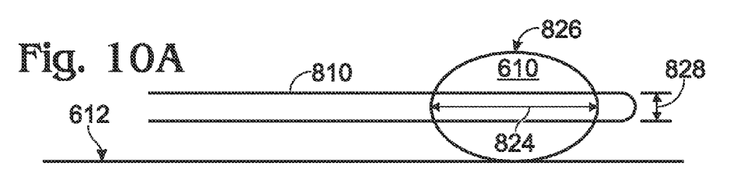
FIGS. 10A and 10B are detailed partial cross-sectional and plan views, respectively, of the connector loop engaged with an IC contact.
Figure 10B:
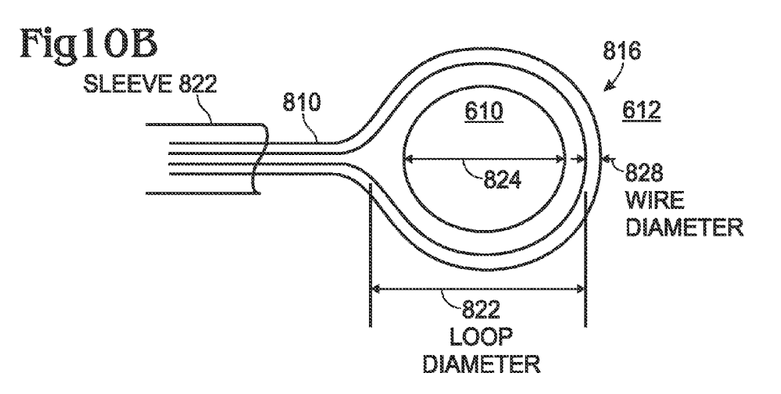

FIGS. 10A and 10B are detailed partial cross-sectional and plan views, respectively, of the connector loop engaged with an IC contact. As shown, the IC contact is a ball grid array (BGA) IC contact. However, the connector can be adapted to interface with any style contact. The loop 816 has a diameter 822 greater than the engaged BGA IC contact diameter 824, so the loop can be slipped over the top 826 of the BGA, past the BGA maximum diameter 824. Typically, the loop 816 is a wire having a wire diameter 828 less than the BGA diameter 824. The smaller wire diameter permits to loop to remain engaged to the BGA contact as the loop is put under tension by the spring. Since the typical BGA contact has a diameter in the range of 10 to 18 mils, the loop diameter 822 is in a range between 10 and 30 mils. A first wire or loop diameter of about 6 mils permits a secure engagement to any BGA contact in the above-mentioned range, however, other diameters will also enable the connector.

Returning to FIG. 9, in one aspect a second wire 830 has a first end 832 connected to the spring second end 808, and a second end 832 connected to the post 802. The second wire 830 is useful in circumstances where the electrical resistance of the spring is relatively high. Thus, the spring 804 has a first electrical resistance and the second wire 830 has a second electrical resistance less than the first resistance. The spring 804 has an extension length 834 when the loop is engaged with the IC contact 820. The second wire 830 has a length 836 greater than the spring extension length. Alternately, the second wire length 836 is selected to prevent the spring from being over-extended.

Figure 11:
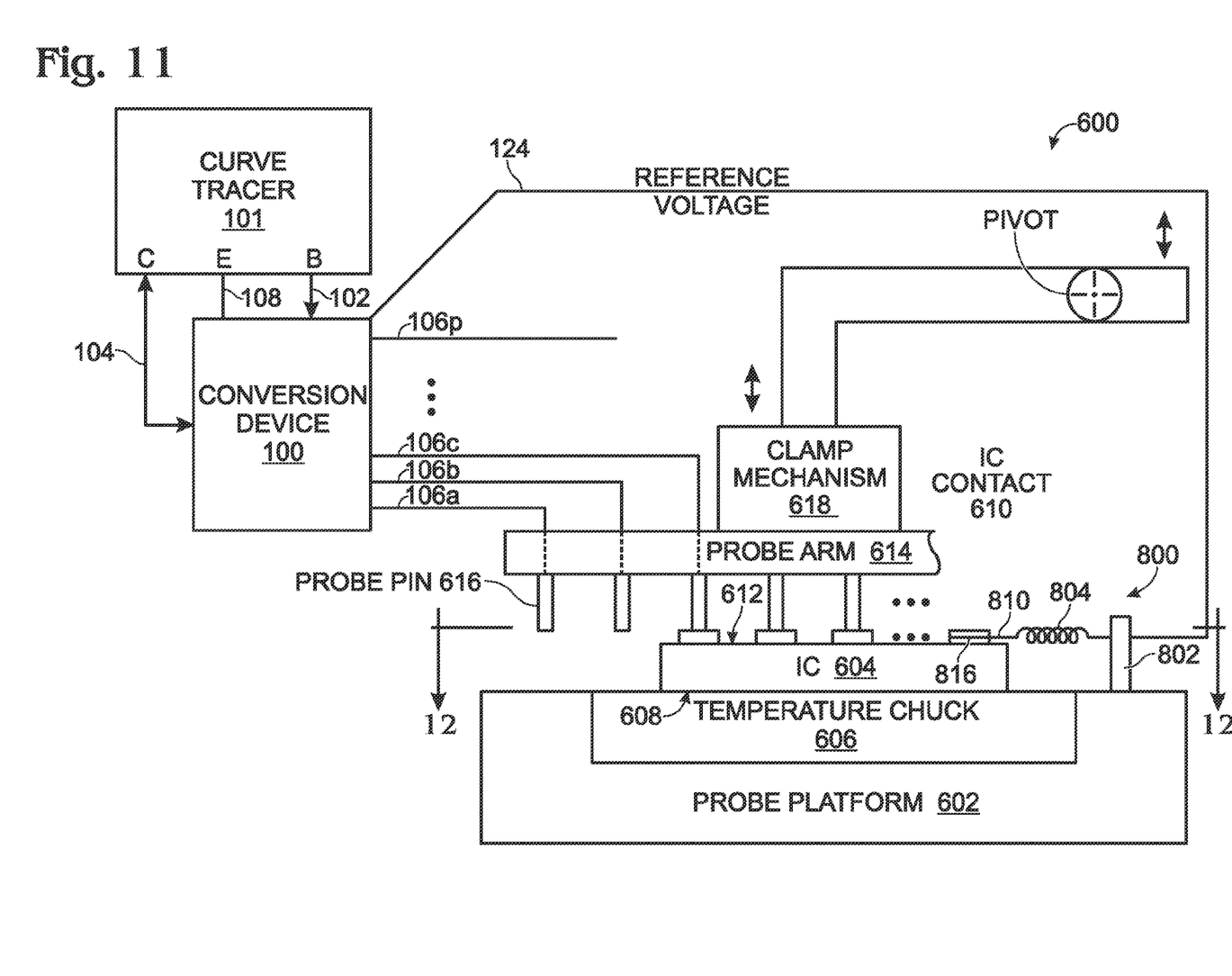
FIG. 11 is a diagram depicting a universal socketless IC test fixture with a contact connector.

FIG. 11 is a diagram depicting a universal socketless IC test fixture with a contact connector. The details of the test fixture have been described above and depicted in FIGS. 1-6, and will not be repeated here in the interest of brevity. As above, the test fixture 600 includes probing platform 602 to accept an IC 604, where the IC 604 has electrical contacts 610 formed on a bottom surface 612 in an array of m rows, where each row includes n, or less contacts. A probe arm 114 includes p probe pins 616, where p is greater than, or equal to n. A clamping mechanism 618 mechanically interfaces the probe arm probe pins 616 to a row of n IC contacts 610 under test.

In addition to the elements depicted in FIG. 6, this aspect of the test fixture includes the IC contact connector 800 described above and depicted in FIGS. 9, 10A, and 10B. Again, in the interest of brevity, only the basic elements of the connector are highlighted. However, it should be understood that connector of FIG. 11 may include all the aspects and variations mentioned above in the description of FIGS. 9, 10A, and 10B.

As above, the connector 800 has an electrically conductive support post 800. An electrically conductive spring 804 has a first end connected to the post 802, and a second end. An electrically conductive first wire 810 having a first end connected to the spring second end, and a second end. An electrically conductive loop 816 with a loop neck is connected to the first wire second end. The wire ends, springs ends, and loop neck are explicitly labeled in FIG. 9. The probe arm 614, clamping mechanism 618, and probe platform 602 work in cooperation to electrically interface a first row of IC contacts. The spring 804 and loop 816 work in cooperation to engage a single IC contact 610 in a second row of IC contacts. As shown, IC contact 610z in engaged.

As shown, the post 802 is connected to the reference voltage on line 124 to enable electrical testing. For example, the post 802 can be connected to the emitter port of a curve tracer through conversion device 100. The post 802 is shown mounted on the probe platform, but alternately, the post need not be mechanically interfaced to the probe platform. Although only a single connector 800 is shown, more than one connector may be used. For example, one connector may be interfaced to an IC contact to power the IC, while another connector is connected to an IC ground.

Figure 12:
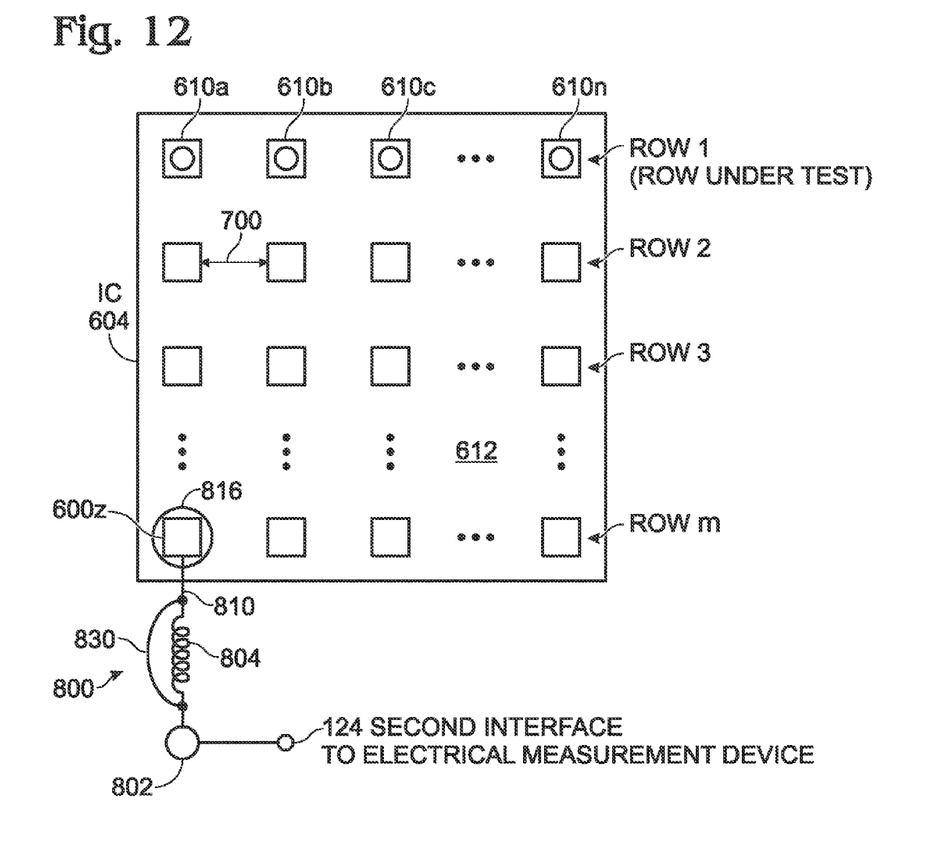
FIG. 12 is a plan view of the IC bottom surface showing the connector engaging IC contact 110z in row m of the IC contacts.

FIG. 12 is a plan view of the IC bottom surface 612 showing the connector 800 engaging IC contact 610z in row m of the IC contacts.

The above-described test fixture makes electrical connections directly to the pins of a package device, using one row of probe pins attached to a probing arm. The probe arm is assembled with the probe pins spacing being the same as that of the package pin pitch. Each row of device pins (contacts) is measured by sequentially stepping the row of probe pins across consecutive rows of package pins. Parametric measurements such as curve tracer analysis may be conducted on each probed pin. The test fixture eliminates the need for sockets and interface boards and permits real-time viewing of the device curves. Further, since the device under test is upside-down (pins up), the probe platform may be a temperature controlled chuck, which permits measurements to be made over temperature.

A universal socketless test fixture, associated IC contact connector, and associated curve tracer conversion device have been provided. Examples of waveforms and hardware implementations have been given to illustrate the invention. However the invention is not limited to merely these examples. Other variations and embodiments of the invention will occur to those skilled in the art.

I claim:

1. A curve tracer signal conversion device, the signal conversion device comprising:
    an input connected to a curve tracer base (B) port to accept a repeating sequence of stepped base signals, a signal input connected to a curve tracer port selected from a group consisting of the collector and emitter ports, and a plurality of signal outputs, where each signal output is sequentially connected to the selected curve tracer port in response to a corresponding base step signal;
    a high pass filter having an input connected to the curve tracer base port, and an output to supply a filtered sequence of stepped base signals;
    a reset module having an input connected to the high pass filter output to accept the filtered repeating sequence of stepped base signals, and an output to supply a reset trigger following each sequence;
    a selector module having an input connected to the high pass filter output to accept the filtered repeating sequence of stepped base signals, and an output to supply a sequence of selection signals in response to the corresponding sequence of stepped base signals; and,
    a counter having a reset input to accept the reset trigger and a clock input to accept the selection signal, the counter having a plurality of parallel outputs, where each output is enabled in sequence in response to the corresponding sequence of selection signals, and where the sequence of outputs is reset to an initial output in response to the reset trigger.

2. The signal conversion device of claim 1 further comprising:
    a network of parallel switches, where each switch has a signal input connected to a curve tracer port selected from a group consisting of a collector (C) and an emitter (E) port, a control input, and a signal output connected to a signal conversion device output.

3. The signal conversion device of claim 2 wherein the network of parallel switches includes gating transistors interposed between the switches and the counter outputs, where each transistor has a base connected to a corresponding counter output, a collector connected to a corresponding switch control input, and an emitter connected to the unselected curve tracer port.

4. The signal conversion device of claim 3 further comprising:
    a reference voltage port connected to the unselected curve tracer port, to supply a reference voltage.

5. The signal conversion device of claim 1 wherein the reset module includes:
    a first resistor having a first end connected the reset module input and a second end connected to a first reference voltage;
    a first diode having an anode connected to the reset module input, and having a cathode;
    a second diode having an anode connected to the first diode cathode, and having a cathode;
    an N channel JFET having a gate connected to the second diode cathode, a source connected to the first reference voltage, and a drain connected to the counter reset input; and,
    a second resistor having a first end connected to the JFET drain, and a second end connected to a second reference voltage having a higher potential that the first reference voltage.

6. The signal conversion device of claim 1 wherein the selector module includes:
    a first resistor with a first end connected to the selector module input, and a second end;
    a first npn transistor with a base connected to the first resistor second end, a collector connected to a second reference voltage, and an emitter;
    a second npn transistor with a base connected to the first npn transistor emitter, an emitter connected to a first reference voltage having a lower potential than the second reference voltage, and a collector;
    a second resistor with a first end connected to the second npn transistor collector, and a second end connected to the second reference voltage;
    a third npn transistor with a base connected to the second npn transistor collector, an emitter connected to the first reference voltage, and a collector connected to the clock input of the counter; and,
    a third resistor with a first end connected to the third npn transistor collector, and a second end connected to the second reference voltage.

7. A universal socketless integrated circuit (IC) electrical test fixture, the test fixture comprising:
    a probing platform to accept an IC, the IC having electrical contacts formed on a bottom surface in an array of m rows, where each row includes n, or less contacts;
    a probe arm including p probe pins, where p is greater than, or equal to n;
    a clamping mechanism to mechanically interface the probe arm probe pins to a row of n IC contacts under test;
    a curve tracer with base, collector, and emitter ports;
    a curve tracer signal conversion device having an input connected to the curve tracer base port to accept a repeating sequence of stepped base signals, a signal input connected to a curve tracer port selected from a group consisting of the collector and emitter ports, and p signal outputs, where each signal output is connected to a corresponding probe pin, wherein the curve tracer signal conversion device includes:
        a high pass filter having an input connected to the curve tracer base port and an output to supply a filtered sequence of stepped base signals;
        a reset module having an input connected to the high pass filter output to accept the filtered repeating sequence of stepped base signals, and an output to supply a reset trigger following each sequence;
        a selector module having an input connected to the high pass filter output to accept the filtered repeating sequence of stepped base signals, and an output to supply a sequence of selection signals in response to the corresponding sequence of stepped base signals; and,
        a counter having a reset input to accept the reset trigger and a clock input to accept the selection signal, the counter having a plurality of parallel outputs, where each output is enabled in sequence in response to the corresponding sequence of selection signals, and where the sequence of outputs is reset to an initial output in response to the reset trigger;

wherein the probe arm, clamping mechanism, and probe platform work in cooperation to electrically interface to any row of the IC contacts;

wherein the probe pins are sequentially connected to the selected curve tracer port in response to a corresponding base step signal; and, wherein m, n, and p are integer variables greater than or equal to 1.

8. The test fixture of claim 7 where the curve tracer signal conversion device further includes a network of parallel switches, where each switch has a signal input connected to the curve tracer selected port, a control input, and a signal output connected to a corresponding probe pin.

9. The test fixture of claim 8 wherein the signal conversion device network of parallel switches includes gating transistors interposed between the switches and the counter outputs, where each transistor has a base connected to a corresponding counter output, a collector connected to a corresponding switch control input, and an emitter connected to the unselected curve tracer port.

10. The test fixture of claim 9 wherein the signal conversion device has a reference voltage port, connected to the unselected curve tracer port, to supply a reference voltage to an IC reference contact.

11. The test fixture of claim 7 wherein the signal conversion device reset module includes:
   a first resistor having a first end connected the reset module input and a second end connected to a first reference voltage;
   a first diode having an anode connected to the reset module input, and having a cathode;
   a second diode having an anode connected to the first diode cathode, and having a cathode;
   an N channel JFET having a gate connected to the second diode cathode, a source connected to the first reference voltage, and a drain connected to the counter reset input; and,
   a second resistor having a first end connected to the JFET drain, and a second end connected to a second reference voltage having a higher potential that the first reference voltage.

12. The test fixture of claim 7 wherein the signal conversion device selector module includes:
   a first resistor with a first end connected to the selector module input, and a second end;
   a first npn transistor with a base connected to the first resistor second end, a collector connected to a second reference voltage, and an emitter;
   a second npn transistor with a base connected to the first npn transistor emitter, an emitter connected to a first reference voltage having a lower potential than the second reference voltage, and a collector;
   a second resistor with a first end connected to the second npn transistor collector, and a second end connected to the second reference voltage;
   a third npn transistor with a base connected to the second npn transistor collector, an emitter connected to the first reference voltage, and a collector connected to the clock input of the counter; and,
   a third resistor with a first end connected to the third npn transistor collector, and a second end connected to the second reference voltage.

13. A curve tracer signal conversion system, the system comprising:
   a curve tracer having a base port, collector port, and emitter port;
   a curve tracer signal conversion device including an input connected to the curve tracer base port to accept a repeating sequence of stepped base signals, a signal input connected to a curve tracer port selected from a group consisting of the collector and emitter ports, and a plurality of signal outputs, where the signal outputs are sequentially connected to the selected curve tracer port in response to a corresponding base step signal;
   a high pass filter having an input connected to a curve tracer base (B) port, and an output to supply a filtered sequence of stepped base signals;
   a reset module having an input connected to the high pass filter output to accept the filtered repeating sequence of stepped base signals, and an output to supply a reset trigger following each sequence;
   a selector module having an input connected to the high pass filter output to accept the filtered repeating sequence of stepped base signals, and an output to supply a sequence of selection signals in response to the corresponding sequence of stepped base signals; and,
   a counter having a reset input to accept the reset trigger and a clock input to accept the selection signal, the counter having a plurality of parallel outputs, where each output is enabled in sequence in response to the corresponding sequence of selection signals, and where the sequence of outputs is reset to an initial output in response to the reset trigger.

14. The system of claim 13 wherein the curve tracer signal conversion device further comprises:
   a network of parallel switches, where each switch has a signal input connected to a curve tracer port selected from a group consisting of a collector (C) and an emitter (E) port, a control input, and a signal output connected to a signal conversion device output.

15. The system of claim 14 wherein the network of parallel switches includes gating transistors interposed between the switches and the counter outputs, where each transistor has a base connected to a corresponding counter output, a collector connected to a corresponding switch control input, and an emitter connected to the unselected curve tracer port.

16. The system of claim 15 wherein the curve tracer signal conversion device further comprises a reference voltage port connected to the unselected curve tracer port, to supply a reference voltage.

17. The system of claim 13 wherein the reset module includes:
   a first resistor having a first end connected the reset module input and a second end connected to a first reference voltage;
   a first diode having an anode connected to the reset module input, and having a cathode;
   a second diode having an anode connected to the first diode cathode, and having a cathode;
   an N channel JFET having a gate connected to the second diode cathode, a source connected to the first reference voltage, and a drain connected to the counter reset input; and,
   a second resistor having a first end connected to the JFET drain, and a second end connected to a second reference voltage having a higher potential that the first reference voltage.

18. The system of claim 13 wherein the selector module includes:
   a first resistor with a first end connected to the selector module input, and a second end;

a first npn transistor with a base connected to the first resistor second end, a collector connected to a second reference voltage, and an emitter;

a second npn transistor with a base connected to the first npn transistor emitter, an emitter connected to a first reference voltage having a lower potential than the second reference voltage, and a collector;

a second resistor with a first end connected to the second npn transistor collector, and a second end connected to the second reference voltage;

a third npn transistor with a base connected to the second npn transistor collector, an emitter connected to the first reference voltage, and a collector connected to the clock input of the counter; and, a third resistor with a first end connected to the third npn transistor collector, and a second end connected to the second reference voltage.

* * * * *